US008923794B2

(12) United States Patent
Aigner (10) Patent No.: US 8,923,794 B2
(45) Date of Patent: Dec. 30, 2014

(54) TEMPERATURE COMPENSATION OF ACOUSTIC RESONATORS IN THE ELECTRICAL DOMAIN

(75) Inventor: Robert Aigner, Ocoee, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 98 days.

(21) Appl. No.: 13/287,859

(22) Filed: Nov. 2, 2011

(65) Prior Publication Data

US 2013/0109332 A1     May 2, 2013

(51) Int. Cl.
*H03H 9/00* (2006.01)
*H04B 1/10* (2006.01)
*H04B 1/16* (2006.01)
*H03H 9/02* (2006.01)
*H03H 9/54* (2006.01)
*H03H 9/56* (2006.01)
*H03H 9/64* (2006.01)
*H04B 1/38* (2006.01)
*H03H 9/60* (2006.01)

(52) U.S. Cl.
CPC ....... *H03H 9/02102* (2013.01); *H03H 9/02834* (2013.01); *H03H 9/542* (2013.01); *H03H 9/568* (2013.01); *H03H 9/6483* (2013.01); *H04B 1/38* (2013.01); *H03H 9/605* (2013.01)
USPC ........... 455/339; 455/286; 455/307; 455/340; 333/193; 333/197

(58) Field of Classification Search
USPC .................... 455/193.1–193.2, 286–287, 307, 455/339–340; 333/133, 187, 189, 191–195
See application file for complete search history.

(56) References Cited

U.S. PATENT DOCUMENTS

| | | | | |
|---|---|---|---|---|
| 4,780,435 | A  * | 10/1988 | Chu et al. ....................... | 501/136 |
| 5,166,646 | A  | 11/1992 | Avanic | |
| 6,639,491 | B2 * | 10/2003 | Toncich ......................... | 333/125 |
| 6,833,774 | B2 * | 12/2004 | Abbott et al. .................. | 333/193 |
| 6,903,626 | B2 * | 6/2005 | Tsutsumi et al. .............. | 333/133 |
| 7,327,205 | B2 * | 2/2008 | Taniguchi ...................... | 333/133 |
| 7,489,063 | B2 * | 2/2009 | Isobe et al. .................... | 310/312 |
| 7,834,720 | B2 * | 11/2010 | Timme .......................... | 333/187 |
| 8,089,195 | B2 * | 1/2012 | Sinha et al. .................... | 310/311 |
| 8,193,877 | B2 * | 6/2012 | Fritz et al. ..................... | 333/133 |
| 8,593,237 | B1 * | 11/2013 | Dai ................................ | 333/234 |
| 2002/0070399 | A1 * | 6/2002 | Kitagawa et al. ............. | 257/296 |
| 2003/0098631 | A1 * | 5/2003 | Ruby et al. .................... | 310/312 |
| 2003/0125191 | A1 * | 7/2003 | Kim et al. ...................... | 501/135 |
| 2003/0128081 | A1 * | 7/2003 | Ella et al. ...................... | 333/133 |
| 2004/0113720 | A1 * | 6/2004 | Komuro et al. ............... | 333/133 |
| 2004/0212458 | A1 * | 10/2004 | Lee ................................ | 333/191 |
| 2005/0110598 | A1 * | 5/2005 | Larson .......................... | 333/191 |
| 2005/0212612 | A1 * | 9/2005 | Kawakubo et al. ....... | 331/117 R |
| 2006/0078492 | A1 * | 4/2006 | Kurozumi et al. ............. | 423/598 |
| 2007/0109073 | A1 * | 5/2007 | Yamakawa et al. ........... | 333/133 |
| 2008/0055020 | A1 * | 3/2008 | Handtmann et al. .......... | 333/189 |
| 2008/0179313 | A1 * | 7/2008 | Vilander ........................ | 219/497 |

(Continued)

FOREIGN PATENT DOCUMENTS

JP          08-018392  A      1/1996
WO        WO01/78229 A1    10/2001

*Primary Examiner* — Simon Nguyen (74) *Attorney, Agent, or Firm* — Schwabe Williamson & Wyatt (57) ABSTRACT

Embodiments of apparatuses, systems and methods relating to temperature compensation of acoustic resonators in the electrical domain are disclosed. Other embodiments may be described and claimed.

21 Claims, 5 Drawing Sheets

(56) References Cited

U.S. PATENT DOCUMENTS

| | | | |
|---|---|---|---|
| 2009/0169839 A1* | 7/2009 | Sugimoto et al. | 428/201 |
| 2010/0194499 A1* | 8/2010 | Wang et al. | 333/187 |
| 2011/0062832 A1* | 3/2011 | Kawashima | 310/370 |
| 2011/0193656 A1* | 8/2011 | Erb et al. | 333/189 |
| 2011/0199168 A1* | 8/2011 | Kadota | 333/195 |
| 2011/0228809 A1* | 9/2011 | Tadigadapa | 374/31 |
| 2012/0262241 A1* | 10/2012 | Phan Le et al. | 331/154 |

* cited by examiner

TEMPERATURE COMPENSATION OF ACOUSTIC RESONATORS IN THE ELECTRICAL DOMAIN

TECHNICAL FIELD

Embodiments of the present invention relate generally to the field of acoustic resonators, and more particularly, to temperature compensation of acoustic resonators in the electrical domain.

BACKGROUND

Acoustic resonators used in radio frequency (RF) filters, such as surface acoustic wave (SAW) filters and bulk acoustic wave (BAW) filters, typically have a negative temperature coefficient of frequency (TCF) that is caused by a decrease of stiffness of materials when temperature increases. Acoustic velocity decreases with temperature and hence a filter's transfer function shifts toward lower frequencies. There are very few materials that show an irregular behavior in this regard. One example is amorphous silicon oxide. The introduction of amorphous silicon oxide to the propagation path of acoustic waves in a SAW or BAW filter may have a temperature-compensating effect and reduce the overall temperature drift of these devices. However, amorphous silicon oxide also introduces various challenges.

Amorphous silicon oxide introduces additional propagation loss, and may thwart the objective of achieving low insertion loss in filters. Furthermore, any additional material introduced into a propagation path of an acoustic wave will reduce a coupling coefficient of a resonator, which relates to the efficiency at which the resonator will convert energy between an acoustic wave form and an electrical form. As a consequence, a maximum relative filter bandwidth that a certain piezo-material can provide may decrease steeply.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Embodiments of the present invention provide resonator circuits that compensate for temperature drift characteristics of acoustic resonators that may otherwise compromise the effectiveness of the acoustic resonators. In particular, the temperature compensated resonator circuits may be incorporated into filters to prevent filter performance from being adversely affected by temperature drift.

In many wireless applications there is a critical filter skirt on either the lower or upper side of a filter's transfer function. However, there is rarely a critical filter skirt on both sides of the transfer function. A critical filter skirt, as used herein, may be an operational specification most likely to be violated in the presence of temperature drift.

Some of the embodiments described herein provide targeted temperature compensation for the elements that have an impact on the portion of the filter's transfer function that is adjacent to the critical filter skirt. By limiting temperature compensation to only a subset of elements in a filter, any negative impact of temperature compensation may have less impact on overall filter performance.

Figure 1A:
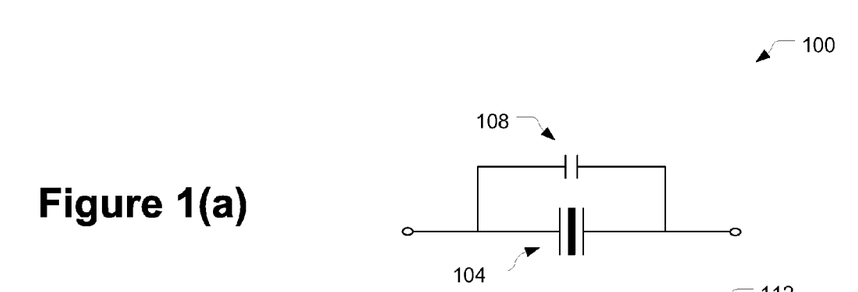
FIGS. 1(a)-1(d) illustrate temperature-compensated resonator circuits in accordance with some embodiments.

FIG. 1(a) illustrates a temperature-compensated resonator circuit 100 in accordance with various embodiments. The resonator circuit 100 may include an acoustic resonator 104 coupled in parallel with a compensating capacitor 108. The resonator circuit 100 may be incorporated into a radio frequency (RF) filter that is configured to provide a transfer function that exhibits a low in-band insertion loss and a high out-of-band insertion loss.

The acoustic resonator 104 may be an electromechanical transducer configured to convert energy between an acoustic wave form and an electrical form. The resonator 104 may oscillate at certain frequencies, called resonance frequencies, with a greater amplitude than at other frequencies. The resonator 104 may generate an electrical signal that corresponds to the oscillations, or, conversely, generate oscillations that correspond to an electrical signal.

The resonator 104 may be associated with a negative temperature coefficient of frequency (TCF) that changes resonance properties associated with the resonator 104 with temperature. In particular, a negative TCF may mean that velocity of acoustic waves will decrease with temperature and, when the resonator 104 is incorporated into an RF filter, this may result in a transfer function shifting toward a lower frequency.

The compensating capacitor 108, C_c, may at least partially compensate for temperature drift of the resonance of the resonator 104. Hereinafter, "C_c" may refer to the capacitor 108 itself, or the capacitance associated with capacitor 108, depending on the context in which it is used. Temperature compensation will be performed in the electrical domain, without modifying acoustic wave propagation on the resonator 104.

The capacitor 108 may be configured to exhibit a negative temperature coefficient of capacitance (TCC), e.g., a capacitance of the capacitor may decrease in response to corresponding increase in temperature. In some embodiments, a negative TCC may be accomplished by using a capacitor having a dielectric material with a high negative temperature coefficient of the dielectric constant (TCK). As used herein, a high negative TCK may refer to a TCK that is more negative than approximately −1,000 ppm/C. In some embodiments, the capacitor 108 may include a dielectric composed of a ceramic formulation that includes calcium titanate (CaTiO3), which may have a TCK of −4,000 ppm/C. The dielectric constant of calcium titanate may be around 160 and the tan-delta may be 0.003.

An acoustic resonator may be modeled using a Butterworth-van-Dyke (BVD) equivalent circuit in which the resonator is represented by a capacitor, C_0, coupled in parallel with a series segment that includes a resistor, R_a, a capacitor, C_a, and an inductor, L_a, coupled in series with one another. In the BVD equivalent circuit, temperature drift of a series resonance, which may also be referred to as resonance frequency, f_s, is dominated by C_a and L_a, while temperature drift of parallel resonance, which may also be referred to as anti-resonance frequency, f_p, is dominated by C_a, C_0, and L_a. R_a models losses of a resonator.

The addition of C_c may not change the resonance frequency of the resonator circuit 100, but it may lower the anti-resonance frequency of the resonator circuit 100. The anti-resonance frequency may be the frequency at which a local maximum of impedance occurs and the resonance frequency may be the frequency at which a local minimum of impedance occurs. The anti-resonance frequency may be given by:

$$f_p = \frac{1}{2\pi} \frac{1}{\sqrt{L_a \frac{(C_0 + C_C) \times C_a}{C_0 + C_C + C_a}}}. \quad \text{Equation 1}$$

The derivative of f_p over C_c may be expressed as:

$$\frac{\partial f_p}{\partial C_C} = -\frac{f_p}{2} \times \frac{C_a}{(C_0 + C_C + C_a)(C_0 + C_C)}. \quad \text{Equation 2}$$

Equation 2 may be further expressed in relative changes in the approximated by:

$$\frac{\frac{\partial f_p}{f_p}}{\frac{\partial C_C}{(C_0 + C_C)}} = \frac{1}{2} \frac{-C_a}{(C_0 + C_C + C_a)} \cong \frac{1}{2}\left[\left(\frac{f_s}{f_p}\right)^2 - 1\right]. \quad \text{Equation 3}$$

For an acoustic resonator with an effective coupling coefficient of $k^2\_eff$, the frequency ratio equals:

$$\frac{f_s}{f_p} \cong 1 - \frac{4}{\pi^2} \times k_{eff}^2. \quad \text{Equation 4}$$

A temperature dependence of the compensation capacitance itself may be:

$$C_c(\Delta T) = C_{C0}(1 + TCK \times \Delta T), \quad \text{Equation 5}$$

where C_C0 is an initial, room-temperature capacitance of the capacitor 104.

To illustrate the effects of the temperature compensation, consider an example in which the resonator 104 is a BAW resonator with an initial effective coupling coefficient of 6.5%. Initially, it may be assumed that the resonator 104 has no temperature drift at all. For this example, C_c may be ¼ of C_0. The shift in f_p may then be calculated as follows.

$$\frac{\frac{\partial f_p}{f_p}}{\frac{\partial C_C}{(C_0 + C_C)}} \cong -0.02, \quad \text{Equation 6}$$

$$\frac{\partial C_C}{\partial T} \frac{C_C}{(C_0 + C_C)} = \quad \text{Equation 7}$$

$$\frac{TCKC_C}{C_0 + C_C} = -4000 \text{ ppm/C} \times \frac{\frac{1}{5}}{\frac{4}{5} + \frac{1}{5}} = -800 \text{ ppm/C},$$

$$\frac{\partial f_p}{\partial T} \frac{1}{f_p} = (-0.02) \times (-800 \text{ ppm/C}) = +16 \text{ ppm/C}. \quad \text{Equation 8}$$

Equation 8 shows that f_p may shift approximately +16 ppm/C in this scenario. A typical BAW filter may exhibit approximately −15 to −17 ppm/C of TCF. Thus, the anti-resonance frequency of the resonator circuit 100 may become temperature stable in this embodiment.

The insertion of the capacitor 108 in this embodiment may reduce the effective coupling coefficient to approximately 5.3%, down from the initial effective coupling coefficient of 6.5%. Such a coupling coefficient loss is less than other methods of attempting temperature compensation and is within an acceptable range of loss.

It may be noted that the temperature drift of the series resonance of the resonator 104 is dominated by C_a and L_a, hence the temperature dependency of C_0 can be ignored in the above calculations.

Figure 1B:
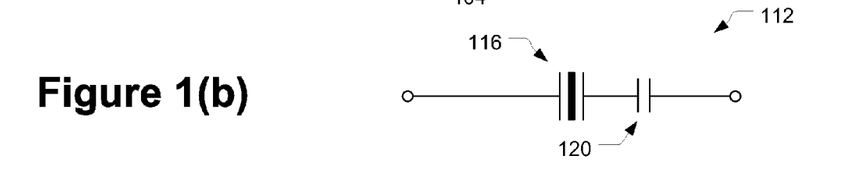

FIG. 1(b) illustrates a temperature-compensated resonator circuit 112 in accordance with various embodiments. The resonator circuit 112 may include an acoustic resonator 116 coupled in series with a compensating capacitor 120.

The temperature compensation of the resonator circuit 112 may be similar to that of resonator circuit 100 except that resonator circuit 112 acts to compensate the temperature drift of the resonance frequency, rather than the temperature drift of the anti-resonance frequency.

Assuming the resonator 116 is a BAW resonator with characteristics similar to those described above, the compensation capacitance for this embodiment may have a value approximately 4 times the static capacitance, C_0, of the resonator 116. In this embodiment, the resonance frequency of the resonator circuit 112 may become temperature stable by placing this compensation capacitance in series with the resonator 116. Degradation of the coupling coefficient may be similar to that described above.

Figure 1C:
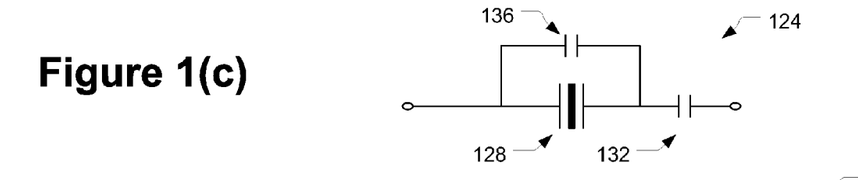

FIG. 1(c) illustrates a temperature-compensated resonator circuit 124 in accordance with various embodiments. The resonator circuit 124 may include an acoustic resonator 128 coupled in series with compensating capacitor 132 and further coupled in parallel with compensating capacitor 136.

The temperature compensation of the resonator circuit 124 may compensate for temperature drift of both the resonance frequency and the anti-resonance frequency. However, resonator circuit 124 may be associated with more degradation of the coupling coefficient than resonator circuits 100 and/or 112.

Figure 1D:
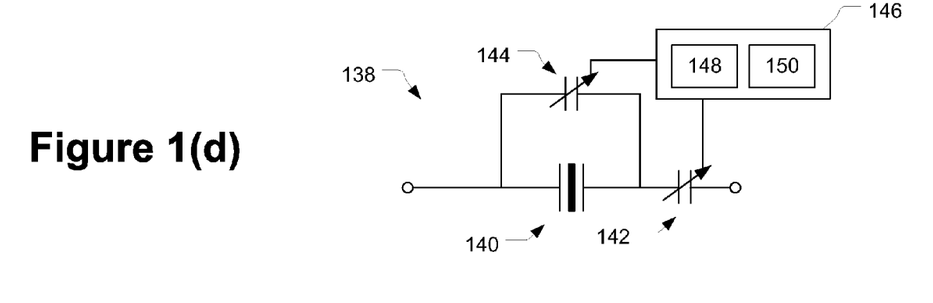

FIG. 1(d) illustrates a temperature-compensated resonator circuit 138 in accordance with various embodiments. The resonator circuit 138 may include an acoustic resonator 140 coupled in series with a variable capacitor 142 and/or coupled in parallel with a variable capacitor 144. The variable capacitors 142 and/or 144 may be coupled with an active control circuit 146 that controls one or both of the variable capacitors 142 and/or 144 such that they exhibit a TCC similar to that described above. The active control provided by the active control circuit 146 may emulate a similar temperature compensation as that described above with respect to capacitors having high TCK dielectric materials. The active control circuit 146 may include control logic 148 and a sensing device 150. The sensing device 150 may sense temperature associated with the acoustic resonator 140, and the control logic 148 may use the sensed temperature to serve as a basis for control of the variable capacitors 142 and/or 144 such that they exhibit desired negative TCC. The variable capacitors 142 and/or 144 may be varactors, tunable capacitors, switched capacitors, etc.

Figure 2:
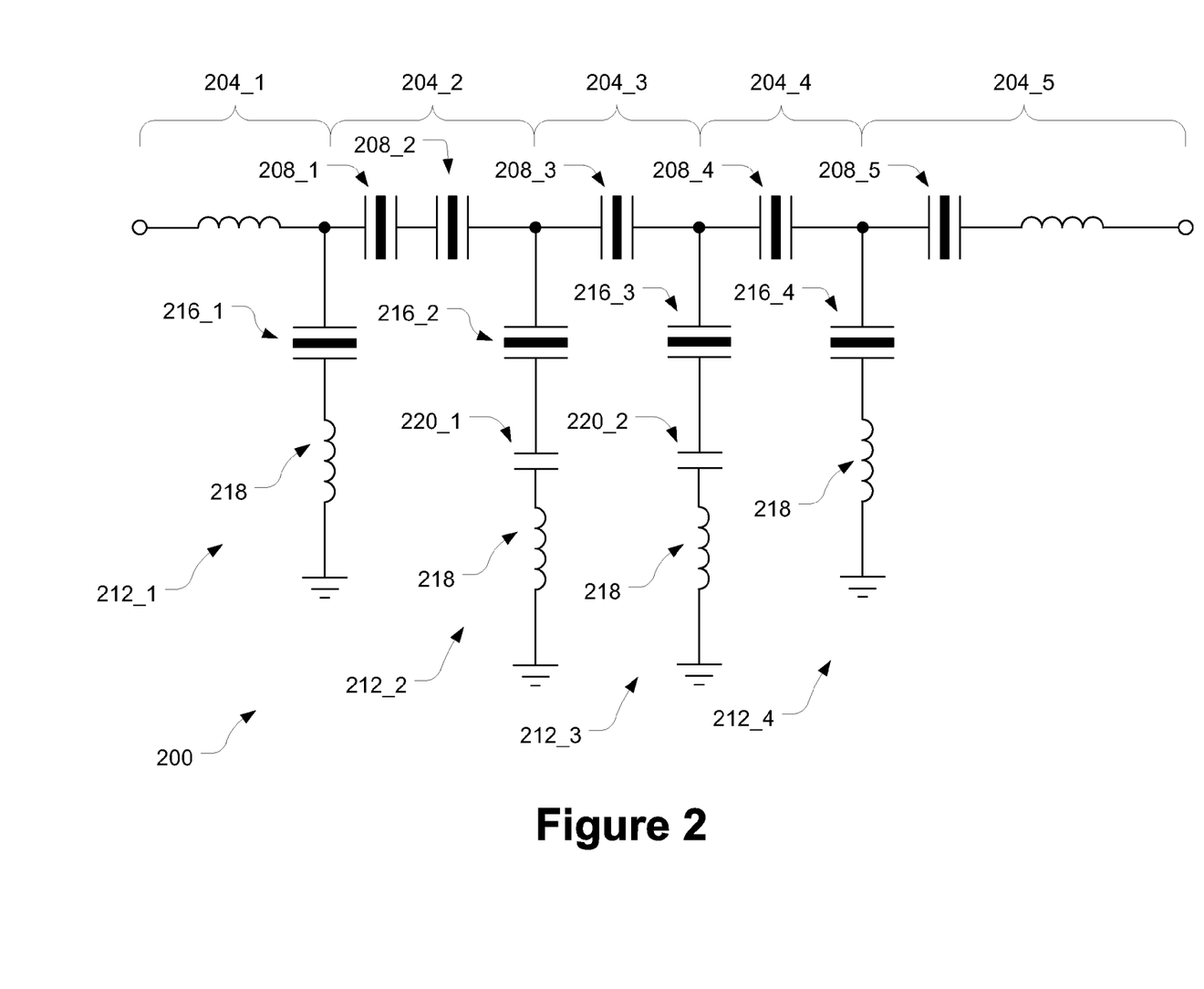
FIG. 2 illustrates a ladder filter in accordance with some embodiments.
Figure 3:
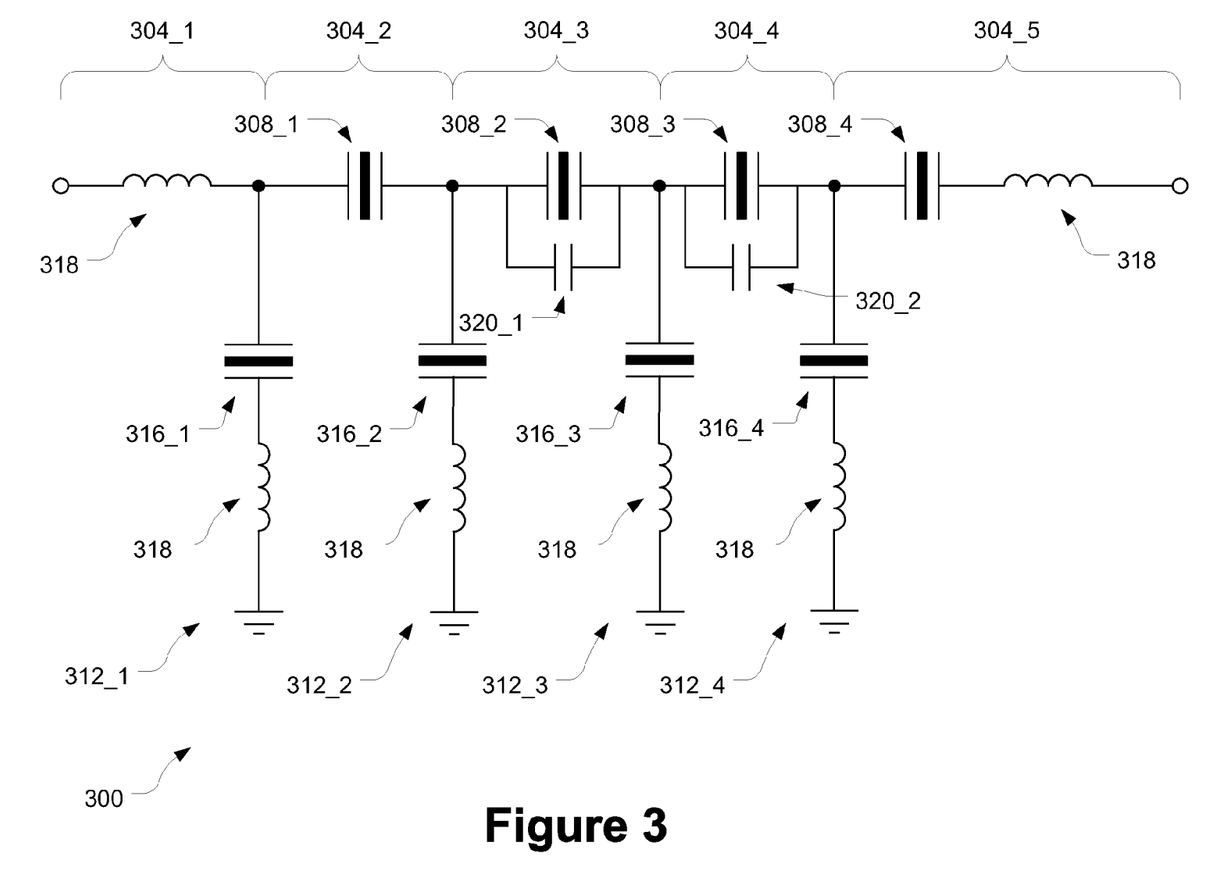
FIG. 3 illustrates a ladder filter in accordance with some embodiments.

Each of the resonator circuits 100, 112, 124, and 138 may be specifically suited for particular applications. FIGS. 2 and 3 show examples of some of these particular applications.

FIG. 2 illustrates a ladder filter 200 in accordance with some embodiments. The ladder filter 200 may be used in an embodiment in which a lower filter skirt is the critical filter skirt. This may be, e.g., when the ladder filter 200 is used as a receive filter for a wireless code division multiple access (WCDMA) band 2 or 25 application. As will be described below, ladder filter 200 may be designed with temperature compensation for elements associated with a lower portion of a transfer function.

The ladder filter 200 may include a number of series segments, e.g., series segments 204_1-5, with series segments 204_2-5 each having at least one of five series resonators 208_1-5 of the ladder filter 200. The series resonators 208_1 and 208_2 may be coupled with one another to form a cascaded pair. The series resonators 208 may each have a common resonance frequency.

The ladder filter 200 may also include four shunt segments 212_1-4, with each including at least one of four shunt resonators 216_1-4 of the ladder filter 200. Shunt resonators 216_1 and 216_4 may include a common resonance frequency f_s1, while shunt resonators 216_2 and 216_3 include a common resonance frequency f_s2, where f_s2−f_s1=14 megahertz in accordance with some embodiments.

The ladder filter 200 may also include a number of inductors 218. These inductors 218 may have small values and may be bond wires or small printed traces on the laminate module.

The ladder filter 200 may include two compensation capacitors, C_c1 220_1 and C_c2 220_2, each having a negative TCC. The compensation capacitors 220 may include calcium titanate, for example, to provide a strong negative TCK. The values of the compensation capacitors 220 may be set to a fixed factor relative to the static capacitance of the resonator in the corresponding shunt segment. For example, C_c1 may be 4 times the capacitance associated with resonator 216_2 and C_c2 may be 4 times the capacitance associated with resonator 216_3.

With application of the ladder filter 200 being only (or at least primarily) concerned with temperature drift in a lower portion of the transfer function, it may be unnecessary to provide temperature compensation for any of the series resonators 208. Further, it may be that temperature compensation is only desirable on a subset of the shunt segments that provide the largest influence on the portion of the transfer function adjacent the lower, critical skirt. In this embodiment, it may be that shunt segments 212_2-3 have the largest impact on the portion of the transfer function of interest. Therefore, only the shunt segments 212_2-3 may have temperature-compensated resonator circuits. This may further reduce any coupling coefficient losses that may be associated with temperature compensation.

FIG. 3 illustrates a ladder filter 300 in accordance with some embodiments. The ladder filter 300 may be used in an embodiment in which an upper filter skirt is the critical filter skirt. This may be, e.g., when the ladder filter 300 is used as a transmit filter for a WCDMA band 2 or 25 application. Therefore, the ladder filter 300 may be designed with temperature compensation for elements associated with an upper portion of the transfer function.

The ladder filter 300 may include a number of series segments, e.g., series segments 304_1-5, with series segments 304_2-5 each having at least one of four series resonators 308_1-4 of the ladder filter 300.

The ladder filter 300 may also include four shunt segments 312_1-4, with each including at least one of four shunt resonators 316_1-4 of the ladder filter 300.

The ladder filter 300 may also include a number of inductors 318. These inductors 318 may have small values and may be bond wires or small printed traces on the laminate module.

The ladder filter 300 may include two compensation capacitors, C_c1 320_1 and C_c2 320_2, that have a strong negative TCK. The compensation capacitors 320 may include calcium titanate, for example, to provide the strong negative TCK. The values of the compensation capacitors 320 may be set to a fixed factor relative to the compensation capacitance of the resonator in the corresponding series segment. For example, C_c1 may be ¼ the capacitance associated with resonator 308_3 and C_c2 may be ¼ the capacitance associated with resonator 308_4.

With application of the ladder filter 300 being only (or at least primarily) concerned with temperature drift in an upper portion of the transfer function, it may be unnecessary to provide temperature compensation for any of the shunt resonators 316. Further, it may be that temperature compensation is only desirable on a subset of the series segments that provide the largest influence on the portion of the transfer function adjacent the upper, critical filter skirt. In this embodiment, it may be that series segments 304_3-4 have the largest impact on the portion of the transfer function of interest. Therefore, only the series segments 304_3-4 may have temperature-compensated resonator circuits. This may further reduce any coupling coefficient losses that may be associated with temperature compensation.

The compensating capacitors used in the embodiments described herein may be thin-film capacitors integrated onto a filtered chip, thick-film capacitors embedded into a substrate or package, or discrete components. As there may be only two interconnections needed to connect a compensation capacitance to a filter, there may be a wide variety of implementation variations. Furthermore, due to the high relative dielectric constant of calcium titanate, at approximately 160 as mentioned above, the compensation capacitors may be relatively small. This may further facilitate their incorporation into various filter designs without difficulty.

Figure 4A:
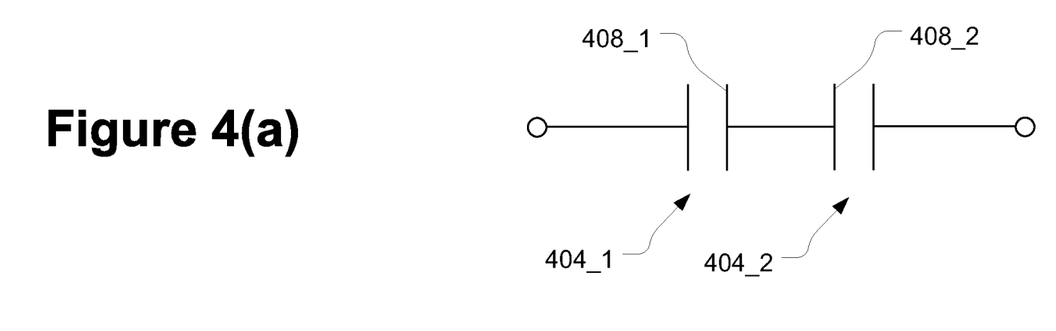
FIGS. 4(a) and 4(b) illustrate compensation capacitor pairs in accordance with some embodiments.

Materials with strongly negative TCK are usually ferroelectric in nature and tend to exhibit a small electrical field dependency of the dielectric constant, which may result in changes in capacitances occurring as a result of changes in voltage. In order to avoid nonlinear distortion that could result from such a behavior, the compensation capacitors may be used in pairs so that the electrical fields of the two capacitances are inverse. For example, FIG. 4(a) illustrates a pair of compensating capacitors 404_1-2 arranged in a cascade configuration in accordance with an embodiment. The two capacitors 404 are coupled in series with one another with their polarities inversed. In particular, a bottom terminal 408_1 of the capacitor 404_1 is coupled with a bottom terminal 408_2 of the capacitor 404_2.

Figure 4B:
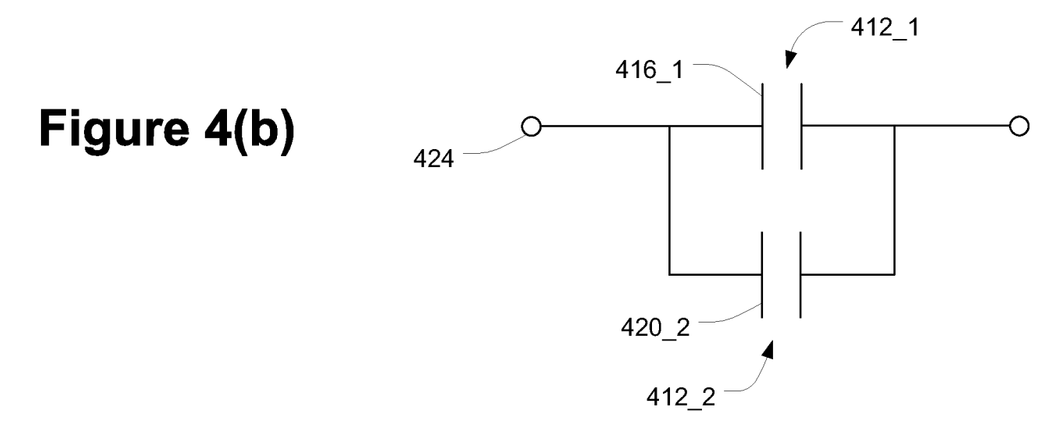

For another example, FIG. 4(b) illustrates a pair of capacitors 412_1-2 arranged in an anti-parallel configuration in accordance with some embodiments. In particular, a top terminal 416_1 of capacitor 412_1 and a bottom terminal 420_2 of capacitor 412_2 are coupled to the same node 424.

Figure 5:
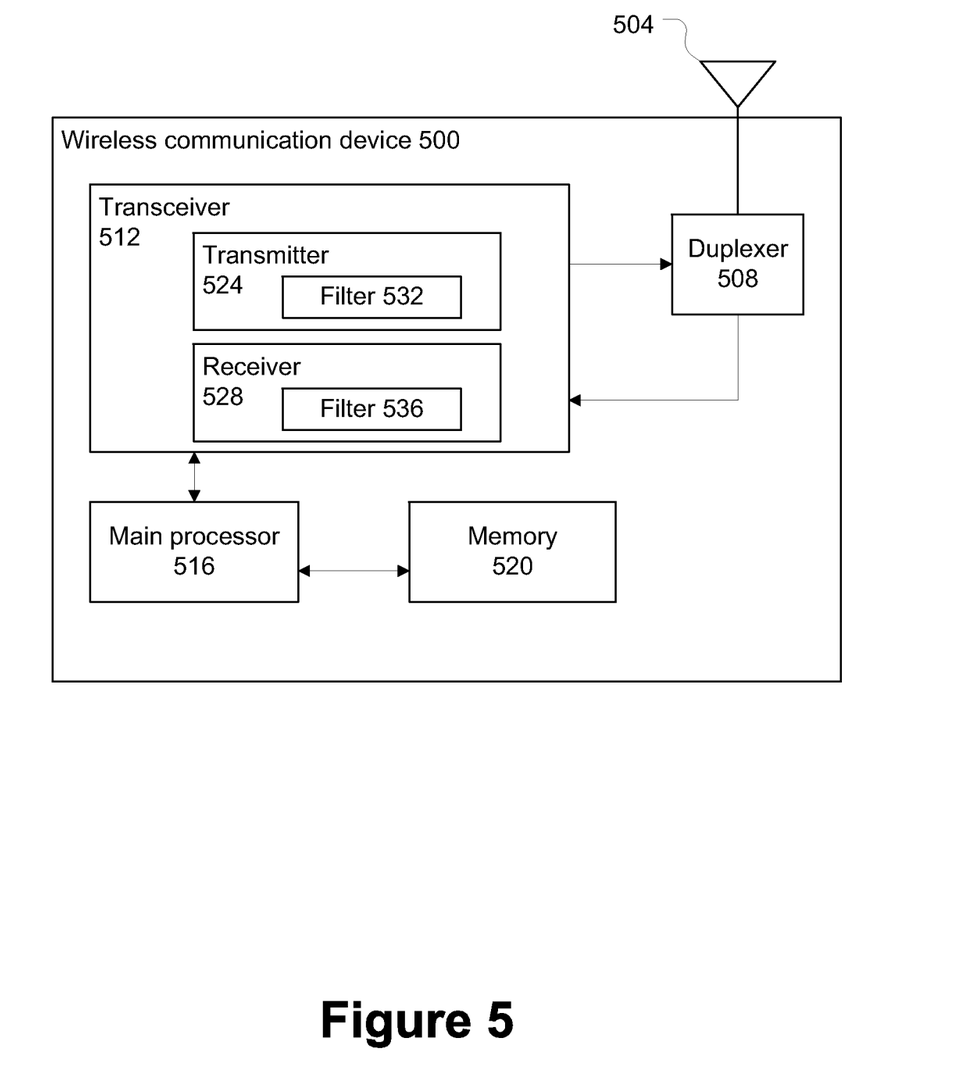
FIG. 5 illustrates a wireless communication device in accordance with some embodiments.

Filters having temperature-compensated resonator may be used in a number of embodiments including, for example, a wireless communication device 500 as shown in FIG. 5 in accordance with some embodiments. In various embodiments, the wireless communication device 500 may be, but is not limited to, a mobile telephone, a paging device, a personal digital assistant, a text-messaging device, a portable computer, a base station, a radar, a satellite communication device, or any other device capable of wirelessly transmitting and/or receiving RF signals.

The wireless communication device 500 may have an antenna structure 504, a duplexer 508, a transceiver 512, a main processor 516, and a memory 520 coupled with each other at least as shown.

The main processor 516 may execute a basic operating system program, stored in the memory 520, in order to control the overall operation of the wireless communication device 500. For example, the main processor 516 may control the reception of signals and the transmission of signals by the transceiver 512. The main processor 516 may be capable of executing other processes and programs resident in the memory 520 and may move data into or out of memory 520, as desired by an executing process.

The transceiver 512 may include a transmitter 524 for transmitting RF signals, communicating outgoing data, through the duplexer 508 and antenna structure 504. The transceiver 512 may additionally/alternatively include a receiver 528 for receiving RF signals, communicating incoming data, from the duplexer 508 and antenna structure 504. The transmitter 524 and receiver 528 may include respective filters 532 and 536. The filters 532 and 536 may have selected temperature-compensated resonator circuits to benefit the functions to which the respective filter is employed. For example, in some embodiments, the filter 532 may be similar to ladder filter 200, while filter 536 may be similar to ladder filter 300.

In various embodiments, the antenna 504 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
    an acoustic resonator configured to convert energy between an acoustic wave form and an electrical form; and
    a capacitor configured to exhibit a negative temperature coefficient of capacitance, the capacitor coupled with the acoustic resonator and configured to at least partially compensate for temperature drift of a resonance frequency or an anti-resonance frequency of the acoustic resonator,
    wherein:
        the capacitor has a high negative temperature coefficient of dielectric constant that is more negative than approximately −1,000 ppm/C, and
        a dielectric material that is composed primarily or solely of calcium titanate.

2. The apparatus of claim 1, wherein the capacitor is coupled in parallel with the acoustic resonator and is configured to at least partially compensate for temperature drift of the anti-resonance frequency of the acoustic resonator.

3. The apparatus of claim 2, wherein another capacitor is coupled in series with the acoustic resonator and is configured to at least partially compensate for temperature drift of the resonance frequency of the acoustic resonator.

4. The apparatus of claim 1, wherein the capacitor is coupled in series with the acoustic resonator and is configured to at least partially compensate for temperature drift of the resonance frequency of the acoustic resonator.

5. The apparatus of claim 1, wherein the high negative temperature coefficient of dielectric constant is approximately −4,000 ppm/C.

6. The apparatus of claim 1, wherein the capacitor is a variable capacitor and the apparatus further comprises:
    an active control circuit having:
        a sensing device to sense temperature associated with the acoustic resonator; and
        control logic configured to control the variable capacitor to exhibit the negative temperature coefficient of capacitance based on the sensed temperature.

7. The apparatus of claim 1, further comprising:
    another capacitor coupled in series with the capacitor in a cascade configuration and configured to further compensate for temperature drift of the resonance frequency or the anti-resonance frequency.

8. The apparatus of claim 1, further comprising:
another capacitor coupled with the capacitor in an anti-parallel configuration and configured to further compensate for temperature drift of the resonance frequency or the anti-resonance frequency.

9. A filter comprising:
a plurality of series segments, with individual series segments having series resonators that are not temperature compensated; and
a plurality of shunt segments, with individual shunt segments having shunt resonators, the plurality of shunt segments including one or more shunt resonators that are temperature compensated,
wherein a first shunt segment of the plurality of shunt segments includes a resonator circuit including:
a shunt resonator of the one or more shunt resonators; and
a capacitor coupled in series with the shunt resonator,
wherein the capacitor includes a negative temperature coefficient of dielectric constant that is more negative than approximately −1,000 ppm/C and a dielectric material that is composed primarily or solely of calcium titanate.

10. The filter of claim 9, wherein the plurality of shunt segments further comprise:
a first subset of shunt resonators that are not temperature compensated; and
a second subset of shunt resonators, including the one or more shunt resonators, that are temperature compensated.

11. The filter of claim 9, wherein the shunt resonators that are temperature compensated are configured to compensate for temperature drift of a portion of a transfer function of the filter that is adjacent to a lower filter skirt.

12. The filter of claim 9, wherein the negative temperature coefficient of dielectric constant is approximately −4,000 ppm/C.

13. A filter comprising:
a plurality of shunt segments, with individual shunt segments having shunt resonators that are not temperature compensated;
a plurality of series segments, with individual series segments having series resonators, the plurality of series segments including one or more series resonators that are temperature compensated,
wherein the capacitor includes a negative temperature coefficient of dielectric constant that is more negative than approximately −1,000 ppm/C and a dielectric material that is composed primarily or solely of calcium titanate.

14. The filter of claim 13, wherein the plurality of series segments further comprise:
a first subset of series resonators that are not temperature compensated; and
a second subset of series resonators, including the one or more series resonators, that are temperature compensated.

15. The filter of claim 13, wherein the one or more series resonators that are temperature compensated are configured to compensate for temperature drift of a portion of a transfer function of the filter that is adjacent to an upper filter skirt.

16. The filter of claim 13, wherein a first series segment of the plurality of series segments includes a resonator circuit including:
a series resonator of the one or more series resonators; and
a capacitor coupled in parallel with the series resonator.

17. The filter of claim 13, wherein the negative temperature coefficient of dielectric constant is approximately −4,000 ppm/C.

18. A system comprising:
an antenna structure;
a transceiver coupled with the antenna structure and configured to receive or transmit radio frequency signals, the transceiver including a filter that has a temperature compensated resonator circuit having:
an acoustic resonator configured to convert energy between an acoustic wave form and an electrical form; and
a capacitor configured to exhibit a negative temperature coefficient of capacitance, the capacitor coupled with the acoustic resonator and configured to at least partially compensate for temperature drift of a resonance frequency or an anti-resonance frequency of the acoustic resonator,
wherein the capacitor includes a negative temperature coefficient of dielectric constant that is more negative than approximately −1,000 ppm/C and a dielectric material that is composed primarily or solely of calcium titanate; and
a processor coupled with the transceiver and configured to send or receive data through radio frequency signals transmitted or received by the transceiver.

19. The system of claim 18, wherein the transceiver includes a transmitter having the filter and the temperature compensated resonator circuit further comprises:
a shunt segment having the acoustic resonator and the capacitor, wherein the acoustic resonator is coupled in series with the capacitor.

20. The system of claim 18, wherein the transceiver includes a receiver having the filter and the temperature compensated resonator circuit further comprises:
a series segment having the acoustic resonator and the capacitor, wherein the acoustic resonator is coupled in parallel with the capacitor.

21. The system of claim 18, wherein the negative temperature coefficient of dielectric constant is approximately −4,000 ppm/C.

* * * * *